United States Patent [19]

Estrada

[11] Patent Number: 4,771,191

[45] Date of Patent: Sep. 13, 1988

[54] TTL TO ECL TRANSLATOR

[76] Inventor: Julio Estrada, 3403-21st St. SE., Puyallup, Wash. 98374

[21] Appl. No.: 10,356

[22] Filed: Feb. 3, 1987

[51] Int. Cl.$^4$ .................... H03K 19/3; H03K 19/092
[52] U.S. Cl. .................................. 307/475; 307/455; 307/456
[58] Field of Search .............. 307/455, 456, 457, 475, 307/559, 264

[56] References Cited

U.S. PATENT DOCUMENTS

| | | | |
|---|---|---|---|
| 4,518,876 | 5/1985 | Constantinescu | 307/475 |
| 4,527,079 | 7/1985 | Thompson | 307/475 |
| 4,607,177 | 8/1986 | Lechner | 307/475 |
| 4,654,549 | 3/1987 | Hanmington | 307/475 |

Primary Examiner—Stanley D. Miller
Assistant Examiner—Richard Roseen
Attorney, Agent, or Firm—Townsend & Townsend

[57] ABSTRACT

An improved TTL to ECL translator circuit having voltage gain is described. First and second transistors are provided, with the base of the second transistor coupled to the collector of the first transistor. The emitter of the second transistor is coupled through a voltage level shifting means to the ECL output. The base of the first transistor is coupled to the TTL input. A clamping means coupled to the collector of the first transistor limits the maximum voltage at the collector.

11 Claims, 3 Drawing Sheets

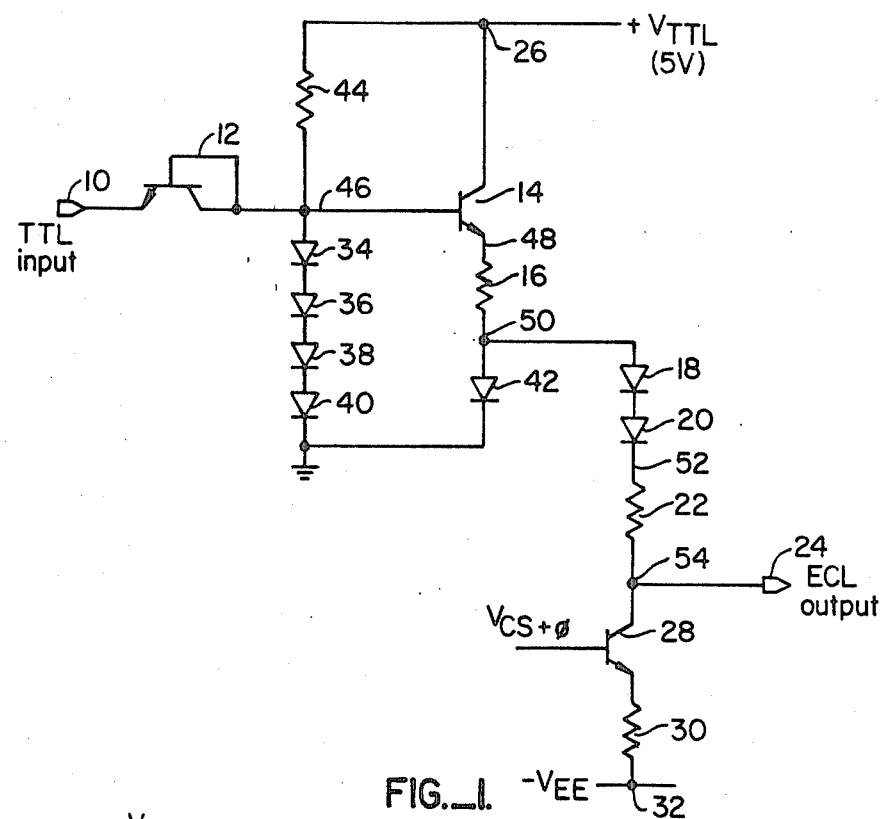
FIG._1.
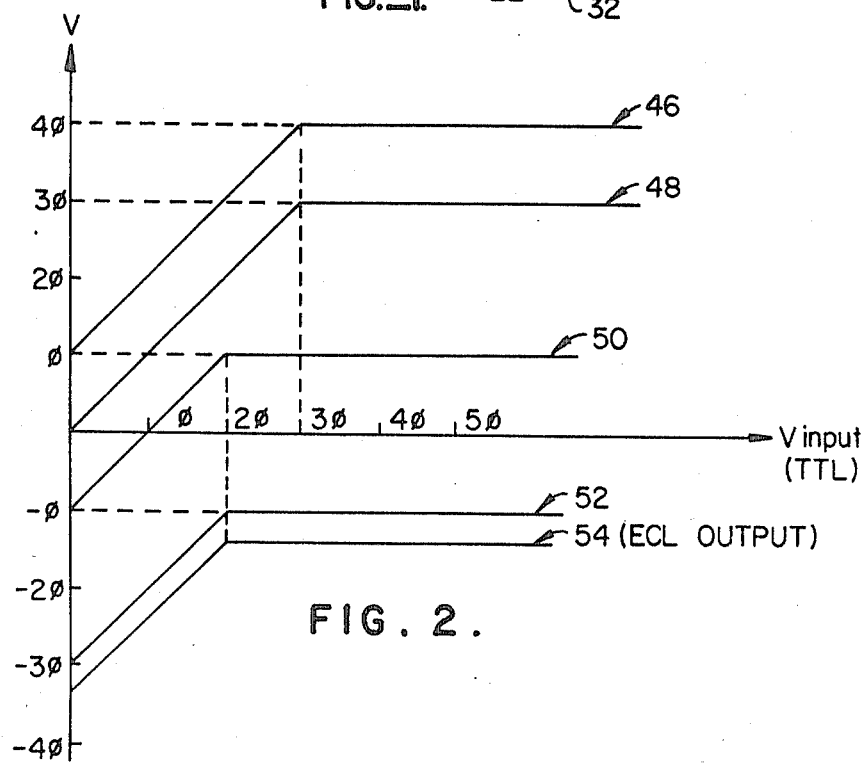
FIG. 2.

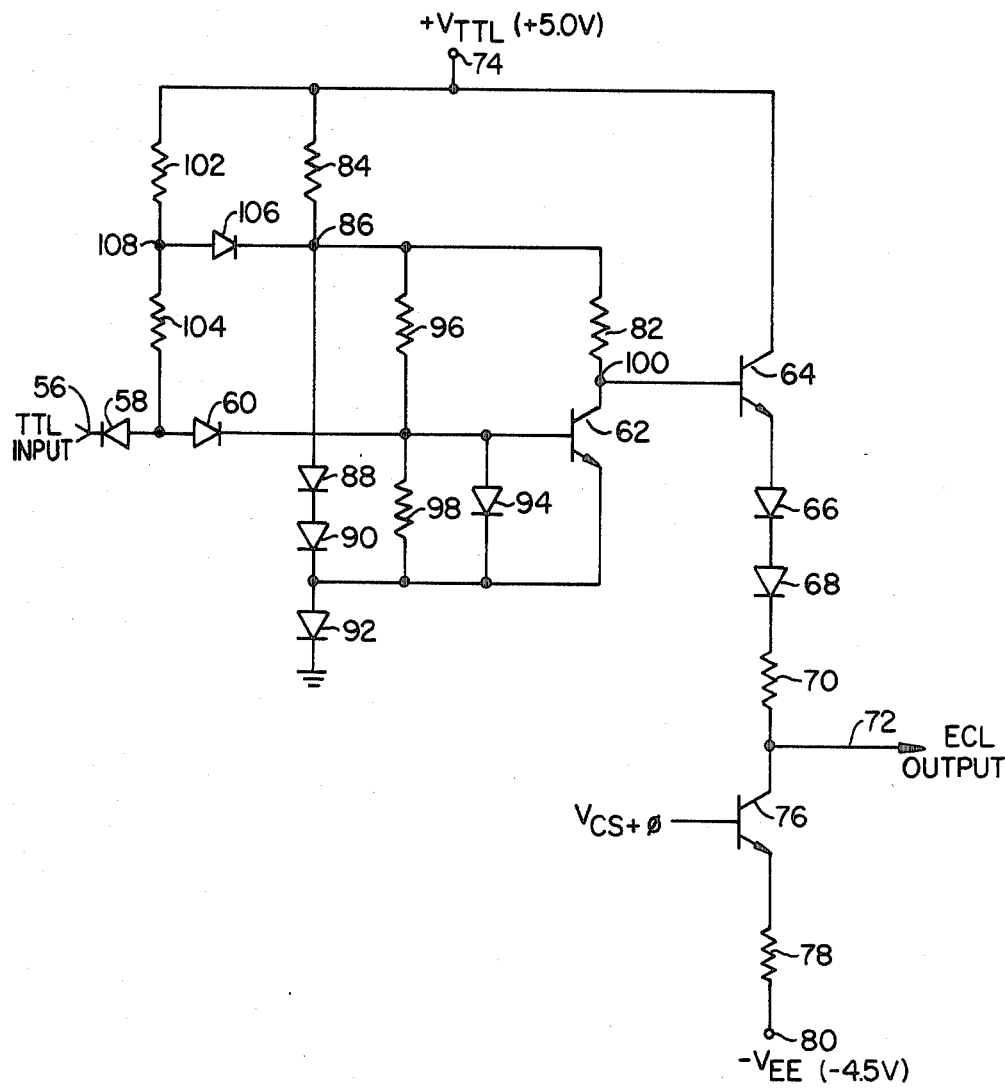
FIG._3.

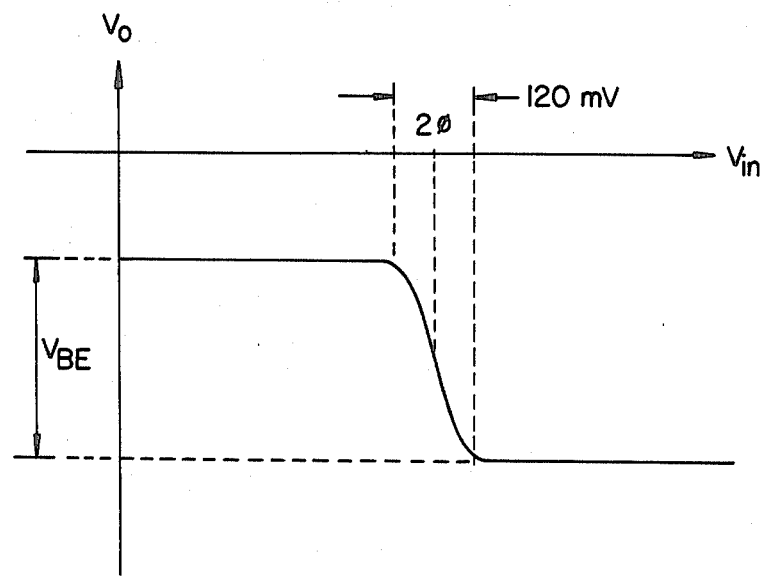
FIG._4.

TTL TO ECL TRANSLATOR

BACKGROUND

The present invention relates to circuits for translating between transistor-transistor logic (TTL) and emitter-coupled logic (ECL).

TTL circuits typically operate between 0 and 5 volts, with the low voltage level being between 0 and 0.8 volts and the high voltage level being between 2.0 and 5.0 volts. ECL circuits, on the other hand, typically operate with a −4.5 volt supply and define a high logic level between −0.880 volts and −1.165 volts and a low logic level between −1.475 volts and −1.810 volts. The purpose of a translator circuit is to transform high and low logic levels from the TTL circuit to high and low logic levels, respectively, to be supplied to an ECL circuit.

An example of a prior art translator circuit is shown in FIG. 1. A TTL input 10 is coupled through a diode 12 to the base of a transistor 14. The emitter of transistor 14 is coupled through a resistor 16, a pair of diodes 18, 20 and a resistor 22 to an ECL output 24. The collector of transistor 14 is coupled to a positive TTL voltage supply 26. ECL output 24 is coupled through a transistor 28 and a resistor 30 to a negative ECL voltage supply 32. The base of transistor 28 is coupled to a voltage equal to the current source voltage of the ECL circuit plus a voltage equal to the base-emitter voltage drop ($\phi$) of a transistor. Four diodes 34, 36, 38 and 40 couple the base of transistor 14 to ground. A diode 42 couples resistor 16 to ground. A resistor 44 couples the base of transistor 14 to the positive voltage supply 26.

The circuit of FIG. 1 operates as follows. A constant current flow from the positive voltage supply 26 to negative voltage supply 32 is provided through transistor 14, resistor 16, diodes 18 and 20, resistor 22, transistor 28 and resistor 30. These elements, through the voltage drop caused by this current, generate the voltage shift needed to translate from TTL to ECL. The value of the current is constant and is giving by the voltage potential across R30 divided by the value of R30. The voltage at one end of R30 is $V_{EE}$, while the voltage at the other end is the base voltage of transistor 28 ($V_{CS}+\phi$) less the base-emitter voltage of transistor 28 ($\phi$). The current is thus given by the following equation:

$$I = [((V_{CS} + \phi) - \phi) - V_{EE}]/R30 = \frac{V_{CS} - V_{EE}}{R30}$$

FIG. 2 shows a plot of the voltage at various nodes in the circuit of FIG. 1 vs. the voltage at TTL input 10. The voltage at node 46 increases from $\phi$ (the base-emitter voltage drop, approximately 0.8 volts) due to the voltage drop across diode 12 to a maximum value of 4$\phi$, which is the high level clamp by diodes 34-40. Node 48 at the emitter of transistor 14 follows a similar path at a level of $\phi$ below node 46. Node 50 follows node 48 until diode 42 clamps node 50 at a voltage of $\phi$. Finally, nodes 52 and 54 follow the voltage at node 50 as shown. Diode 42 thus limits the high level ECL output and diodes 34-40 correspondingly limit the voltage at the base of transistor 14 so that current is not wasted for the clamped high level ECL output. As can be seen from FIG. 2, the slope of the output transfer curve for node 54 is less than one, meaning that the circuit has attenuation since the voltage gain is less than one. The wide transition region makes the circuit susceptible to noise.

SUMMARY OF THE INVENTION

The present invention is an improved TTL to ECL translator circuit having voltage gain. The voltage gain and other characteristics of the present invention provide several advantages over the prior art. The transfer characteristics provide for a steady low ECL value and a steady high ECL value with a relatively narrow transition region. The narrow transition region increases the translator's input signal-to-noise margin.

First and second transistors (see FIG. 3) are provided with the base of the second transistor coupled to the collector of the first transistor. The emitter of the second transistor is coupled through a voltage level shifting means to the ECL output. The base of the first transistor is coupled to the TTL input. A clamping means coupled to the collector of the first transistor limits the maximum voltage at the collector.

In the preferred embodiment, the level shifting means is a pair of diodes and a resistor. A third transistor and a resistor couple the ECL output to the negative ECL supply voltage. A collector resistor is coupled to the collector of the first transistor at one end and to a series combination of three diodes coupled to ground at the other end. These three diodes and the collector resistor are in turn coupled through another resistor to the positive TTL voltage supply. A diode is coupled between the base and emitter of the first transistor to control its turning on and off. The TTL input is coupled to the base of the first transistor through a pair of diodes having their anodes coupled together, with the anode junction coupled to the positive TTL voltage supply through a pair of resistors. This pair of resistors has a junction coupled to the anode of another diode which is coupled at its cathode to the junction of the collector resistor and the clamping diodes.

A pair of biasing resistors are also provided to bias the first transistor and the diode from its base to emitter at the verge of turning on. A combination of the first and second transistors provide voltage gain between the TTL input and the ECL output.

The ECL output voltage swing is independent of variations in the TTL supply voltage due to the manner in which the voltage levels are set, as discussed below. Because the ECL output voltage swing is approximately one $V_{BE}$, the circuit is faster than the prior art circuit of FIG. 1 which has a swing of approximately 2 $V_{BE}$. The present invention can be used with 10K or 100K ECL, or any other type of ECL.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a schematic diagram of a prior art TTL to ECL translator;

FIG. 2 is a graph of the voltage at various nodes of FIG. 1 vs. the input voltage;

FIG. 3 is a schematic diagram of a preferred embodiment of a circuit according to the present invention; and FIG. 4 is a graph of output voltage vs. input voltage for the circuit of FIG. 3.

DETAILED DESCRIPTION OF THE PREFERRED EMBODIMENT

FIG. 3 shows a preferred embodiment of a TTL to ECL translator circuit according to the present invention. A TTL input 56 is coupled through diodes 58 and 60 to a transistor 62. These diodes, as well as all others shown in FIG. 3, can be formed using transistors in an integrated circuit with the base and collector of the transistor being coupled together to form the anode and the emitter forming the cathode of the diode.

The collector of transistor 62 is coupled to the base of a transistor 64. The emitter of transistor 64 is coupled through diodes 66 and 68 and resistor 70 to an ECL output 72. The collector of transistor 64 is coupled to a positive TTL voltage supply 74 ($V_{TTL}$). ECL output 72 is coupled through a transistor 76 and a resistor 78 to a negative ECL voltage supply ($V_{EE}$) 80.

The collector of transistor 62 is coupled to $V_{TTL}$ through resistors 82 and 84. A node 86 at the junction of these two resistors is coupled to ground through three diodes 88, 90 and 92. A diode 94 is coupled across the base and emitter of transistor 62. Resistors 96 and 98 bias diode 94 and transistor 62 at a voltage where only a slight increase is necessary to turn it on.

In operation, for a low TTL input, the collector of transistor 62, node 100, has its voltage set by the voltage drop across resistors 84 and 82. Current flows through resistors 102 and 104 and then out through diode 58 to the TTL input 56. Diodes 60 and 106 are thus reverse biased. Because transistor 62 is biased at the edge of turning on, very little current flows through resistor 82. The ECL output voltage is thus set by the voltage drop between node 100 and ECL output 72.

When a TTL input becomes high, diode 58 becomes reverse biased and diodes 60 and 106 become forward biased. Thus, transistor 62 is turned fully on and more current flows through resistor 82, thus increasing the voltage drop across resistor 82 and lowering the voltage level at node 100. This in turn lowers the voltage level at ECL output 72. The input threshold is set by diodes 92, 94, 60 and 58. The current flow from the TTL voltage supply flows through diodes 60, 94 and 92 to ground to give a voltage level of $3\phi$ at the anode of diode 60. The voltage drop of $\phi$ across diode 58 gives an input threshold of approximately $2\phi$.

Referring again to FIG. 3, when the TTL input potential is low, the current through resistors 102 and 104 flows through diode 58 out into the driving source, and diodes 60 and 106 are therefore reverse-biased. Diodes 88, 90 and 92 are "on" and, because of the voltage dividing action of resistors 96 and 98, diode 94 is biased at the edge of turning-on. Transistor 62 mirrors the emitter current of diode 94, which is very small. The voltage drop across resistor 82 due to the collector current of transistor 62 is negligible and the node 100 potential is like node 86 or $3V_{BE}(3\phi)$. The ECL output 72 (for this input condition of TTL input low) follows node 100 minus the constant voltage drop from output 72 to node 100. This is shown in the following equations:

$$V_{100-72} = 3V_{BE} + \frac{R70}{R78} V_{cs} \quad (1)$$

$$\text{then: } V_{72} = V_{100} - V_{100-72} = 3V_{BE} - \left(3V_{BE} + \frac{R70}{R78} V_{cs}\right) \quad (2)$$

$$V_{72}^{Low} = -\frac{R70}{R78} V_{cs} \quad (3)$$

When the input potential is TTL logic high, node 108 is clamped at $4V_{BE}$, and the voltage across resistor 104 is one $V_{BE}$. The current through resistor 104 ($V_{BE}/R104$) is applied to transistor (connected as a diode) 94, then transistor 62 increases its collector current proportionally to the emitter area ratio "n" of the transistor 94 emitter area to the transistor 62 emitter area. Because of the transistor 62 collector current increase, the voltage drop across resistor 82 increases to n ($V_{BE}/R104$)R82.

The potential at node 100 is now:

$$V_{100} = V_{86} - V_{86-100} = 3V_{BE} - n(V_{BE})\frac{R82}{R104} \quad (4)$$

As before, the ECL output voltage when the TTL input is high is:

$$V_{72} = V_{100} - V_{100-72} \quad (5)$$

$$V_{72} = \left(3V_{BE} - n V_{BE}\frac{R82}{R104}\right) - \left(3V_{BE} + \frac{R70}{R78} V_{cs}\right) \quad (6)$$

$$V_{72}^{high} = -n V_{BE}\frac{R82}{R104} - \frac{R70}{R78} V_{cs} \quad (7)$$

Thus, as long as the TTL boltage supply has a power capacity high enough to provide the current needed, the ECL output level is independent of the TTL voltage supply level.

The ECL output swing is:

$$V_{72}^{low} - V_{72}^{high} = \quad (8)$$

$$\left(-\frac{R70}{R78} V_{cs}\right) - \left(-n V_{BE}\frac{R82}{R104} - \frac{R70}{R78} V_{cs}\right)$$

$$V_{swing} = V_{72}^{low} - V_{72}^{high} = n V_{BE}\frac{R82}{R104} \quad (9)$$

Thus the ECL output voltage swing is independent of $V_{cs}$ and thus independent of changes in $V_{cs}$ due to temperature changes. Rather, the temperature coefficient of $V_{swing}$ is that of $V_{BE}$ multiplied by nR82/R104. To determine the voltage gain of the circuit, the minimum required voltage change at the input to switch the output swing, or the input voltage change required to cause diode 58 to turn on and off, is calculated. Assuming a 100:1 current change through diode 58, we can write:

$$I_{D58} = I_S e^{(V58/V_T - 1)} \quad (10)$$

Eliminating the $-1$, which is negligible compared to V58/$V_T$ for the voltages of interest, and rewriting gives:

$$V_{58}^{on} - V_{58}^{off} = V_T Ln \frac{I_{D58}^{on}}{I_{D58}^{off}} = 26 \text{ mV } Ln\ 100 = 120 \text{ mv} \quad (11)$$

The gain is then:

$$A_v = \frac{V_{swing}}{V_{D58}^{on} - V_{D58}^{off}} = \frac{nV_{BE}\frac{R82}{R104}}{V_T Ln \frac{I_{D58}^{on}}{I_{D58}^{off}}} \quad (12)$$

for the particular case of $n\frac{R82}{R104} = 1$:

$$A_v = \frac{V_{BE}}{120 \text{ mv}} = \frac{820 \text{ mv}}{120 \text{ mv}} = 7$$

FIG. 4 shows a plot of the voltage at TTL input 56 vs. the voltage at ECL output 72. As can be seen, the output voltage is a constant level until the input voltage is within approximately 60 millivolts of $2\phi$. Then, the output makes a transition over a period of 120 millivolts of the input to a second output level which is lower than the low level ECL level by an amount equal to $\phi$. Thus, the present invention results in a constant high and low level ECL output over a wide range of TTL inputs with a small transition region. The present invention also gives a large variation between the low and high level ECL outputs due to the voltage gain of the translator circuit.

As will be understood by those familiar with the art, the present invention may be embodied in other specific forms without departing from the spirit or essential characteristics thereof. For example, additional diodes could be added between node 86 and diode 88 with corresponding diodes being added between the emitter of transistor 64 and diode 66 to raise the clamping level. Accordingly, the disclosure of the preferred embodiment of the invention is intended to be illustrative, but not limiting, of the scope of the invention which is set forth in the following claims.

What is claimed is:

1. A TTL to ECL translator circuit comprising:
   a TTL input node connected to receive electrical signals;
   a first transistor having a first output electrode and a control electrode, said control electrode being coupled to said TTL input node;
   a second transistor having a first output electrode and a control electrode; said control electrode being coupled to said first output electrode of said first transistor;
   clamping means, coupled between said first output electrode of said first transistor and a voltage reference, for limiting the maximum voltage at said first output electrode of said first transistor to a predetermined level;
   an ECL output node; and
   level shifting means, coupled between said first output electrode of said second transistor and said ECL output node, for shifting the voltage level between said second transistor and said ECL output node.

2. The circuit of claim 1 wherein said clamping means comprises first, second and third diodes coupled in series, an anode of said first diode being coupled to said first output electrode of said first transistor, a cathode of said third diode being coupled to ground, said first and second transistors being NPN transistors, said first output and control electrodes of said first transistor being a collector and base, respectively, said first output and control electrodes of said second transistor being an emitter and a base respectively.

3. The circuit of claim 2 wherein said emitter of said first transistor is coupled to an anode of said third diode and further comprising a fourth diode having an anode and a cathode coupled to said base and said emitter, respectively, of said first transistor.

4. The circuit of claim 1 further comprising a supply voltage, a first diode having a cathode coupled to said control electrode of said first transistor, a first resistance having a first end coupled to an anode of said first diode and a second end coupled to said supply voltage and a second diode having an anode coupled to said anode of said first diode and a cathode coupled to said TTL input node.

5. The circuit of claim 4 further comprising:
   a second resistance having a first end coupled to said first output electrode of said first transistor;
   a third resistance having a first end coupled to a second end of said second resistance and a second end coupled to said supply voltage;
   a fourth resistance coupled between said second end of said first resistance and said supply voltage; and
   a third diode having an anode coupled to said second end of said first resistance and a cathode coupled to said second end of said second resistance.

6. The circuit of claim 1 wherein said level shifting means comprises a series combination of first and second diodes and a first resistance and further comprising an ECL voltage supply, a third transistor having a first output electrode coupled to said ECL output node and a second resistance coupled between a second output terminal of said third transistor and said ECL voltage supply.

7. A TTL to ECL translator circuit, comprising:
   a TTL input node connected to receive electrical signals;
   a positive TTL voltage supply;
   an ECL output node;
   a negative ECL voltage supply;
   a first NPN transistor having a collector coupled to said TTL voltage supply;
   a series combination of first and second diodes and a first resistor coupling an emitter of said first transistor to said ECL output node;
   a second NPN transistor having a collector coupled to said ECL output node;
   a second resistor coupling an emitter of said second NPN transistor to said negative ECL voltage supply;
   a third NPN transistor having a collector coupled to a base of said first NPN transistor;
   a third diode having an anode coupled to an emitter of said third transistor and a cathode coupled to ground;
   a fourth diode having an anode coupled to a base of said third NPN transistor and a cathode coupled to said emitter of said third NPN transistor;
   fifth and sixth diodes in series with an anode of said sixth diode being coupled to a cathode of said fifth diode, an anode of said fifth diode being coupled to said collector of said third NPN transistor and a cathode of said sixth diode being coupled to said emitter of said third NPN transistor;
   a seventh diode having a cathode coupled to a base of said third NPN transistor;
   an eighth diode having an anode coupled to an anode of said seventh transistor and a cathode coupled to said TTL input node; and first and second means, coupled between said TTL voltage supply and said base, and between said TTL voltage supply and said collector, respectively, of said third transistor, for providing current from said positive TTL voltage supply to said base and said collector of said third transistor.

8. The circuit of claim 7 wherein said first means for providing current comprises third and fourth resistors coupled in series between said positive TTL voltage supply and said anode of said seventh diode, and said second means for providing current comprises fifth and sixth resistors coupled in series between said positive TTL voltage supply and said collector of said third NPN transistor, said anode of said fifth diode being coupled to a junction of said fifth and sixth resistors.

9. The circuit of claim 8 further comprising a ninth diode having an anode coupled to a junction of said third and fourth resistors and a cathode coupled to said anode of said fifth diode.

10. The circuit of claim 1 wherein said level shifting means comprises a diode.

11. The circuit of claim 1 wherein said predetermined level is approximately three times the voltage drop across a forward-biased junction between said control electrode and said first output electrode of said second transistor.

* * * * *